(12) United States Patent
Choi

(10) Patent No.: US 8,816,362 B2
(45) Date of Patent: Aug. 26, 2014

(54) ORGANIC LIGHT EMITTING DISPLAY

(75) Inventor: Sang-Moo Choi, Yongin (KR)

(73) Assignee: Samsung Display Co., Ltd., Yongin-is (KR)

( * ) Notice: Subject to any disclaimer, the term of this patent is extended or adjusted under 35 U.S.C. 154(b) by 465 days.

(21) Appl. No.: 12/942,940

(22) Filed: Nov. 9, 2010

(65) Prior Publication Data
US 2011/0227098 A1    Sep. 22, 2011

(30) Foreign Application Priority Data

Mar. 17, 2010 (KR) .................. 10-2010-0023761

(51) Int. Cl.
H01L 51/52 (2006.01)
(52) U.S. Cl.
USPC .................. 257/88; 257/40; 345/98
(58) Field of Classification Search
USPC ............. 257/59, 88, 72, E51.018, E51.022, 257/E51.026
See application file for complete search history.

(56) References Cited

U.S. PATENT DOCUMENTS

| 6,771,028 B1* | 8/2004 | Winters | 315/169.1 |
|---|---|---|---|
| 2005/0174313 A1* | 8/2005 | Kawachi | 345/98 |
| 2006/0186822 A1* | 8/2006 | Park | 315/169.3 |
| 2008/0246026 A1* | 10/2008 | Kim | 257/40 |

FOREIGN PATENT DOCUMENTS

| KR | 10-2005-0076734 | 7/2005 |
|---|---|---|
| KR | 10-2006-0034161 A | 4/2006 |
| KR | 10-2006-0034574 A | 4/2006 |
| KR | 10-2007-0083072 | 8/2007 |
| KR | 10-2007-0092694 | 9/2007 |
| KR | 10-2008-0023498 A | 3/2008 |

OTHER PUBLICATIONS

KIPO Office Action dated Aug. 30, 2011 for KR Application No. 10-2010-0023761 (1 page).

* cited by examiner

Primary Examiner — Howard Weiss
Assistant Examiner — Sue Tang
(74) Attorney, Agent, or Firm — Christie, Parker & Hale, LLP

(57) ABSTRACT

An organic light emitting display is capable of reducing or minimizing the number of wiring lines to improve an aperture ratio. The organic light emitting display includes scan lines and data lines that cross each other at crossing regions, sub pixels located at the crossing regions that display an image in accordance with an amount of current that flows from a first power source to respective organic light emitting diodes in the sub pixels, and first power source lines that are parallel to the data lines, each of the first power source lines corresponding to at least two of the data lines. The first power source lines include a first group of the first power source lines that receive the first power source and a second group of the first power source lines that receive a second power source.

7 Claims, 3 Drawing Sheets

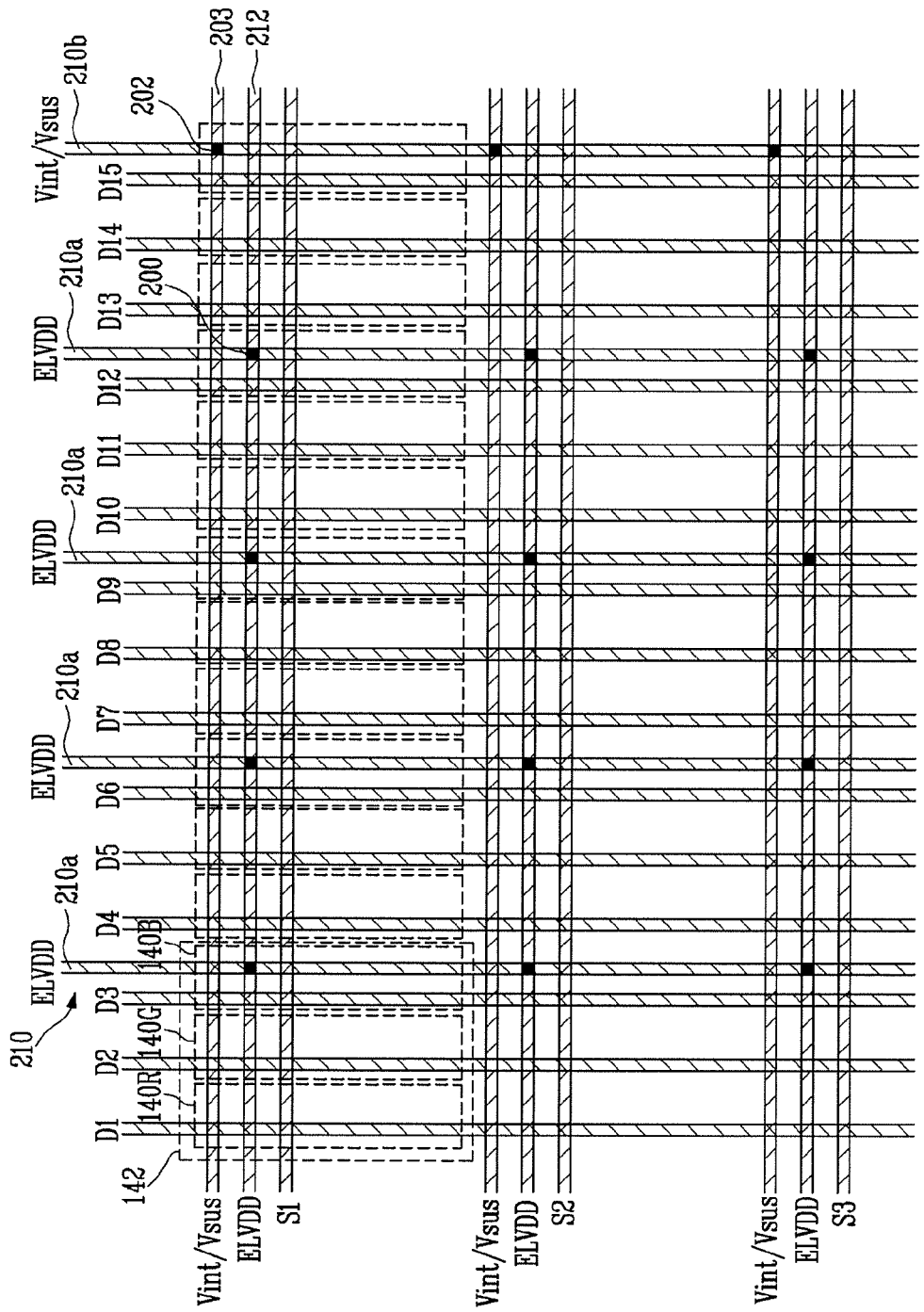

ORGANIC LIGHT EMITTING DISPLAY

CROSS-REFERENCE TO RELATED APPLICATION

This application claims priority to and the benefit of Korean Patent Application No. 10-2010-0023761, filed on Mar. 17, 2010, in the Korean Intellectual Property Office, the entire content of which is incorporated herein by reference.

BACKGROUND

1. Field

One or more embodiments of the present invention relate to an organic light emitting display.

2. Description of Related Art

Recently, various flat panel displays (FPDs) capable of reducing weight and volume that are disadvantages of cathode ray tubes (CRTs) have been developed. The FPDs include liquid crystal displays (LCDs), field emission displays (FEDs), plasma display panels (PDPs), organic light emitting displays, and the like.

Among the FPDs, the organic light emitting display displays images using organic light emitting diodes (OLEDs) that generate light by the recombination of electrons and holes. The organic light emitting display has advantages of a high response speed while being driven with low power consumption.

The organic light emitting display includes a plurality of pixels arranged at crossing regions of data lines and scan lines in the form of a matrix. In general, each of the pixels includes an OLED, at least two transistors, and at least one capacitor.

In an organic light emitting display, an amount of current that flows to the OLED varies with the threshold voltage variation of the driving transistor included in each of the pixels and non-uniform displaying may therefore occur. That is, properties of the driving transistor, such as its threshold voltage, vary with the manufacturing process of the driving transistor included in each of the pixels, making it very difficult to manufacture all transistors of the organic light emitting display to have the same properties using current manufacturing technologies. Therefore, the threshold voltage variation of the driving transistors occurs.

In order to solve the above-mentioned problems, a pixel including six transistors and at least one capacitor was suggested in Korean Patent Publication No. 2007-0083072. The conventional pixel is coupled to a plurality of wiring lines including an initialization lines coupled to an initialization power source.

FIG. 1 is a view illustrating a related art wiring line structure for a group of sub pixels. In FIG. 1, for the sake of convenience, the internal structure of the sub pixels is omitted.

Referring to FIG. 1, related art sub pixels 2R, 2G, and 2B are located at crossing regions of data lines Di, Di+1, and Di+2, respectively, and a scan line Si. The red sub pixel 2R coupled to the $i^{th}$ data line Di and the $i^{th}$ scan line Si is additionally coupled to power source lines 10a and 10b and initialization lines 12a and 12b.

Of the power source lines 10a and 10b, the first power source line 10a is parallel to the data line Di and receives power from a first power source ELVDD, which may be externally supplied. The first power source line 10a is electrically coupled to a transistor included in the red sub pixel 2R and supplies the voltage of the first power source ELVDD to the red sub pixel 2R.

Of the power source lines 10a and 10b, the second power source line 10b is parallel to the scan line Si and is electrically coupled to the first power source line 10a by a first contact hole 20. The second power source line 10b is coupled to the first power source line 10a to reduce or minimize a voltage drop of the first power source ELVDD.

Of the initialization lines 12a and 12b, the first initialization line 12a is parallel to the data line Di and is coupled to an initialization power source Vint. The first initialization line 12a is electrically coupled to a transistor included in the red sub pixel 2R and supplies a voltage of the initialization power source Vint to the red sub pixel 2R.

Of the initialization lines 12a and 12b, the second initialization line 12b is parallel to the scan line Si and is electrically coupled to the first initialization line 12a by a second contact hole 22. The second initialization line 12b is coupled to the first initialization line 12a to reduce or minimize a voltage drop of the initialization power source Vint.

However, since each of the above sub pixels 2R, 2G, and 2B is coupled to six wiring lines, a layout structure is complicated and an aperture ratio is reduced. For example, as each of the sub pixels 2R, 2G, and 2B is coupled to a plurality of wiring lines, yield is reduced so that manufacturing cost increases.

SUMMARY

Accordingly, an aspect of embodiments according to the present invention provides an organic light emitting display capable of reducing or minimizing the number of wiring lines to improve an aperture ratio.

In order to achieve the foregoing and/or other aspects of the present invention, according to an embodiment of the present invention, there is provided an organic light emitting display, including scan lines and data lines crossing each other at crossing regions, sub pixels located at the crossing regions and configured to display an image in accordance with an amount of current that flows from a first power source to respective organic light emitting diodes in the sub pixels, and first power source lines parallel to the data lines, each of the first power source lines corresponding to at least two of the data lines, the first power source lines including a first group of the first power source lines configured to receive a first power from the first power source and a second group of the first power source lines that are different from the first group and configured to receive a second power from a second power source.

The first power source lines may be located at substantially the same distance from each other.

At least two adjacent ones of the first power source lines are organized as a block.

The block may include at least one of the second group of the first power source lines.

The organic light emitting display may further include second power source lines that are parallel to the scan lines and electrically coupled to the first group of the first power source lines via first contact holes.

The second power source lines may be electrically coupled to the sub pixels.

Each of the second power source lines may be located at a corresponding one of horizontal lines.

The organic light emitting display may further include third power source lines that are parallel to the scan lines and electrically coupled to the second group of the first power source lines via second contact holes.

Each of the third power source lines may be located at a corresponding one of horizontal lines.

According to another embodiment of the present invention, there is provided an organic light emitting display including scan lines and data lines crossing each other at crossing regions, sub pixels located at the crossing regions and configured to display an image in accordance with an amount of current that flows from a first power source to respective organic light emitting diodes in the sub pixels, and first power source lines that are parallel to the data lines, each of the first power source lines corresponding to at least two of the data lines.

The organic light emitting display may further include second power source lines that are parallel to the scan lines, each of the second power source lines being located at a corresponding one of horizontal lines and electrically coupled to the first power source lines via first contact holes.

In the organic light emitting display according to embodiments of the present invention, since one first power source line is provided for every at least two data lines, the number of wiring lines may be reduced or minimized. In addition, in the first power source lines, a first group of first power source lines receives a first power source and the second group of first power source line receives a power source different from the first power source. That is, according to embodiments of the present invention, at least two power sources may be supplied to sub pixels using the first power source lines separated from each other by substantially the same distance so that a wiring line structure may be simplified.

BRIEF DESCRIPTION OF THE DRAWINGS

The accompanying drawings, together with the specification, illustrate exemplary embodiments of the present invention, and, together with the description, serve to explain the principles of the present invention.

FIG. 3 is a schematic diagram illustrating a wiring line structure according to the embodiment of the present invention shown in FIG. 2.

DETAILED DESCRIPTION

Figure 1:
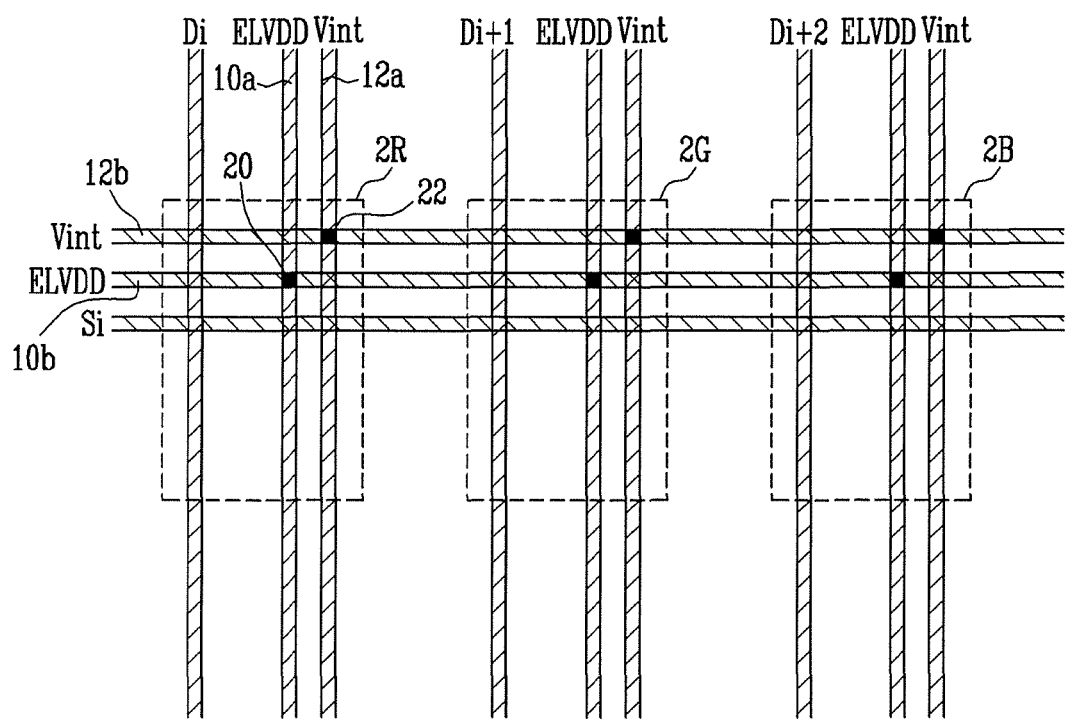
FIG. 1 is a view illustrating a related art wiring line structure.

Hereinafter, certain exemplary embodiments according to the present invention will be described with reference to the accompanying drawings. Here, when a first element is described as being coupled to a second element, the first element may be directly coupled to the second element or may be indirectly coupled to the second element via one or more other elements. Further, some of the elements that are not essential to a complete understanding of the invention are omitted for clarity. Also, like reference numerals refer to like elements throughout. The embodiments of the present invention may have different forms, and should not be construed as being limited to the descriptions set forth herein. Accordingly, hereinafter the exemplary embodiments by which those skilled in the art may perform the present invention are described in detail with reference to FIGS. 2 and 3 to merely explain aspects of embodiments according to the present invention.

Figure 2:
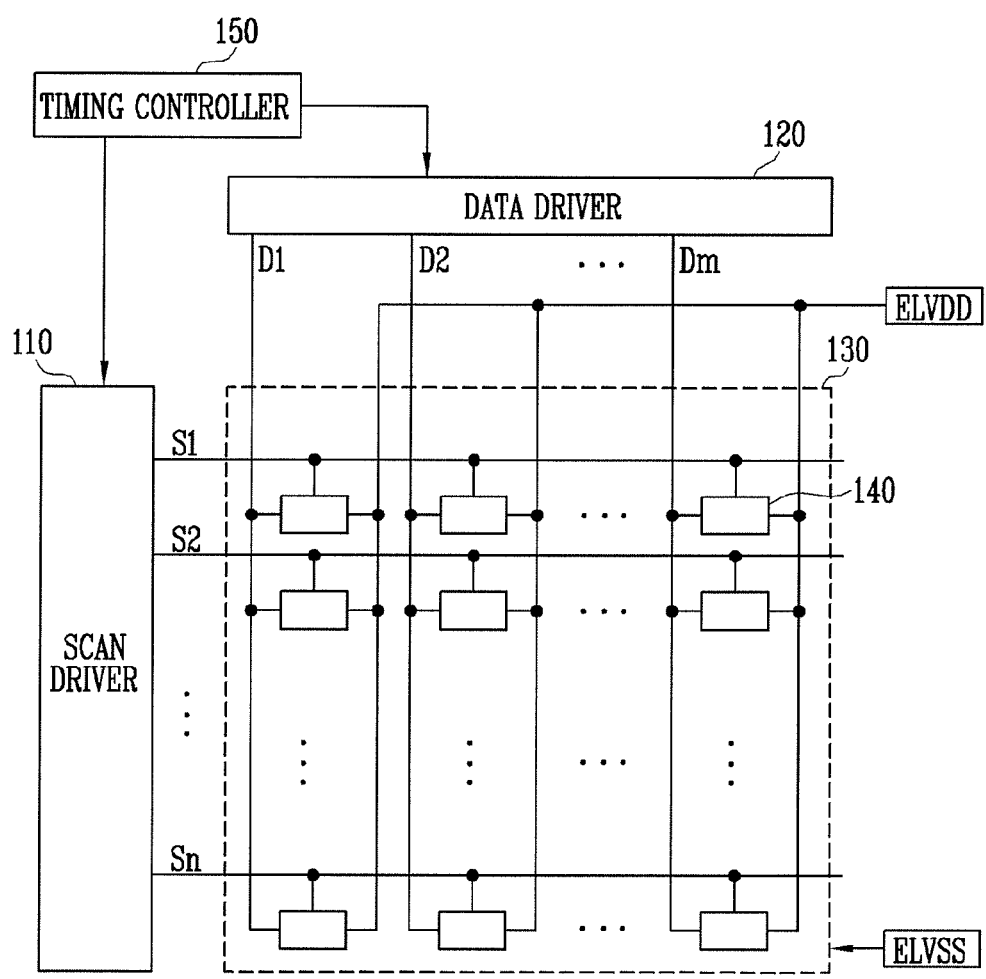
FIG. 2 is a view illustrating an organic light emitting display according to one embodiment of the present invention.

FIG. 2 is a view illustrating an organic light emitting display according to one embodiment of the present invention.

Referring to FIG. 2, the organic light emitting display includes a display unit 130 including sub pixels 140 located at crossing regions of scan lines S1 to Sn and data lines D1 to Dm, a scan driver 110 for driving the scan lines S1 to Sn, a data driver 120 for driving the data lines D1 to Dm, and a timing controller 150 for controlling the scan driver 110 and the data driver 120.

The scan driver 110 generates scan signals through control by the timing controller 150 and supplies (e.g., sequentially supplies) the generated scan signals to the scan lines S1 to Sn.

The data driver 120 generates data signals through control by the timing controller 150 and supplies the generated data signals to data lines D1 to Dm in synchronization with the scan signals.

The timing controller 150 controls the scan driver 110 and the data driver 120. In addition, the timing controller 150 realigns data, which may be externally supplied, and transmits the realigned data to the data driver 120.

The display unit 130 includes the sub pixels 140 located at the crossing regions of the scan lines S1 to Sn and the data lines D1 to Dm. The sub pixels 140 receive power from a first power source ELVDD and a second power source ELVSS, both of which may be externally supplied. The sub pixels 140 are selected when the scan signals are supplied, allowing the sub pixels to receive the data signals and supply current corresponding to the received data signals from the first power source ELVDD to the second power source ELVSS via OLEDs to generate light.

Each of the sub pixels 140 additionally receives an initialization power from an initialization power source or a reference power source, both of which may be externally provided, to compensate for the threshold voltage of a driving transistor or a voltage drop of the first power source ELVDD.

FIG. 3 is a schematic diagram illustrating a wiring line structure according to one embodiment of the present invention. In FIG. 3, for the sake of convenience, the internal structure of the sub pixels is not illustrated.

Referring to FIG. 3, sub pixels 140R, 140G, and 140B are located at the crossing regions of data lines D1 to D3 and a scan line S1, although it should be understood that other sub pixels may be located at crossing regions of other data lines and scan lines. That is, each sub pixel is coupled to one data line (one of D1 to Dm) and one scan line (one of S1 to Sn).

The sub pixels 140R, 140G, and 140B are the red sub pixel 140R, the green sub pixel 140G, and the blue sub pixel 140B, respectively, as determined by the wavelength or wavelengths of light they may generate. For example, the red sub pixel 140R generates red light having brightness corresponding to a data signal, the green sub pixel 140G generates green light having brightness corresponding to a data signal, and the blue sub pixel 140B generates blue light having brightness corresponding to a data signal. The red sub pixel 140R, the green sub pixel 140G, and the blue sub pixel 140B that are adjacent each other constitute one pixel 142.

First power source lines 210 are each located among no less than i ("i" is a natural number no less than 2) data lines to run parallel to the data lines D1 to Dm. For example, there may be a first power source line 210 for every group of sub pixels, that is, for every three data lines (i.e., a first power source line 210 for D1 to D3, a first power source line 210 for D4 to D6, etc.).

The first power source lines 210 located among the data lines D1 to Dm are separated from each other by substantially the same distance (e.g., the power source lines 210 are located at regular intervals). Among the first power source lines 210 arranged by substantially the same distance, a first group of first power source lines 210a is coupled to the first power source ELVDD and a second group of first power source lines 210b is coupled to a power source different from the first power source (for example, an initialization power source Vint or a reference power source Vsus).

The first group of first power source lines 210a may be a block in units of j ("j" is a natural number no less than 2) adjacent first power source lines 210, and are coupled to the first power source ELVDD. For example, as illustrated in FIG. 3, the first group of first power source lines 210a may be a block in units including four first power source lines 210.

The first group of first power source lines 210a is electrically coupled to second power source lines 212 that are parallel to the scan lines S1 to Sn via first contact holes 200. The second power source lines 212 may each be located at one of the horizontal lines and are electrically coupled to transistors included in each of the sub pixels 140R, 140G, and 140B. The second power source lines 212 transmit power from the first power source ELVDD via the first group of first power source lines 210a to the sub pixels 140R, 140G, and 140B.

The second group of first power source lines 210b is each among the first power source lines 210 that constitute a block (e.g., a group) by at least one. In other words, at least one of the second group of first power source lines is in each block (e.g., as a group). For example, and as shown in FIG. 3, there may be one second group first power source line 210b for every four first group first power source lines 210a.

The power source (e.g., the initialization power source Vint or the reference power source Vsus) to which the second group of first power source lines 210b is coupled does not supply current to sub pixels 142R, 142G, and 142B. That is, the voltage drop is substantially not generated in a power source to which the second group of first power source lines 210b is coupled. Therefore, although the sub pixels 142R, 142G, and 142B are arranged among the first power source lines 210 that constitute a block, the sub pixels 142R, 142G, and 142B may be stably driven.

The second group of first power source lines 210b are electrically coupled via second contact holes 202 to third power source lines 203, which are parallel to the scan lines S1 to Sn. The third power source lines 203 may each be at a corresponding one of the horizontal lines and are electrically coupled to transistors included in each of the sub pixels 140R, 140G, and 140B. The third power source lines 203 transmit power from the power source (such as the initialization power source Vint or the reference power source Vsus) via the second group of first power source lines 210b to the sub pixels 140R, 140G, and 140B.

According to the above-described embodiment, since the first power source lines 210 are located among (e.g., corresponding to or shared by) two or more data lines, as opposed to only one data line, the number of wiring lines may be reduced or minimized. In addition, according to embodiments of the present invention, at least two power sources are supplied to the first power source lines 210 that are separated by substantially the same distance from each other (e.g., located at regular intervals), so that the number of wiring lines required for supplying power from a power source may be reduced or minimized.

While the present invention has been described in connection with certain exemplary embodiments, it is to be understood that the exemplary embodiments described herein should be considered in a descriptive sense only, and that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   scan lines and data lines crossing each other at crossing regions;
   sub pixels located at the crossing regions and configured to display an image in accordance with an amount of current that flows from a first power source to respective organic light emitting diodes in the sub pixels;
   first power source lines parallel to the data lines, each of the first power source lines corresponding to at least two of the data lines that are configured to provide data to different columns of the sub pixels, the first power source lines comprising:
      a first group of the first power source lines configured to receive a first power from the first power source; and
      a second group of the first power source lines that are different from the first group and configured to receive a second power from a second power source,
   second power source lines that are parallel to the scan lines and electrically coupled to the first group of the first power source lines via first contact holes; and
   third power source lines that are parallel to the scan lines and electrically coupled to the second group of the first power source lines via second contact holes.

2. The organic light emitting display as claimed in claim 1, wherein the first power source lines are located at substantially the same distance from each other.

3. The organic light emitting display as claimed in claim 1, wherein at least two adjacent ones of the first power source lines are organized as a block.

4. The organic light emitting display as claimed in claim 3, wherein the block comprises at least one of the second group of the first power source lines.

5. The organic light emitting display as claimed in claim 1, wherein the second power source lines are electrically coupled to the sub pixels.

6. The organic light emitting display as claimed in claim 1, wherein each of the second power source lines is located at a corresponding one of horizontal lines.

7. The organic light emitting display as claimed in claim 1, wherein each of the third power source lines is located at a corresponding one of horizontal lines.

* * * * *